United States Patent [19]
Miyoshi

[11] Patent Number: 5,134,402
[45] Date of Patent: Jul. 28, 1992

[54] TRI-LEVEL DIGITAL-ANALOG CONVERTER AND ANALOG-DIGITAL CONVERTER HAVING TRI-LEVEL DIGITAL-ANALOG CONVERTER

[75] Inventor: Seiji Miyoshi, Yokohama, Japan
[73] Assignee: Fujitsu Limited, Kawasaki, Japan
[21] Appl. No.: 599,444
[22] Filed: Oct. 18, 1990

[30] Foreign Application Priority Data
Oct. 27, 1989 [JP] Japan ................... 1-280736

[51] Int. Cl.$^5$ .................... H03M 1/66; H03M 3/02; H03M 1/12
[52] U.S. Cl. ........................... 341/144; 341/143; 341/155
[58] Field of Search ............ 341/144, 143, 155, 126, 341/127

[56] References Cited
PUBLICATIONS
Matsuya et al., "A 16-bit Oversampling A to D Conversion Technology Using Triple-Integration Noise Shaping," IEEE Journal of Solid-State Circuits, vol. SC-22, No. 6, Dec. 1987, pp. 921-929.

Primary Examiner—Sharon D. Logan
Attorney, Agent, or Firm—Staas & Halsey

[57] ABSTRACT

A tri-level digital-analog converter includes a first analog signal generating circuit for generating a first analog signal which corresponds to a "+1" level of a digital input signal, a second analog signal generating circuit for generating a second analog signal which corresponds to a "−1" level of the digital input signal, a third analog signal generating circuit for generating a third analog signal which corresponds to a "0" level of the digital input signal, and a selector coupled to the first, second and third analog signal generating circuits for selectively outputting one of the first, second and third analog signals in response to the digital input signal as an output analog signal. This tri-level digital-analog converter is suited for use in an oversampling analog-digital converter.

18 Claims, 6 Drawing Sheets

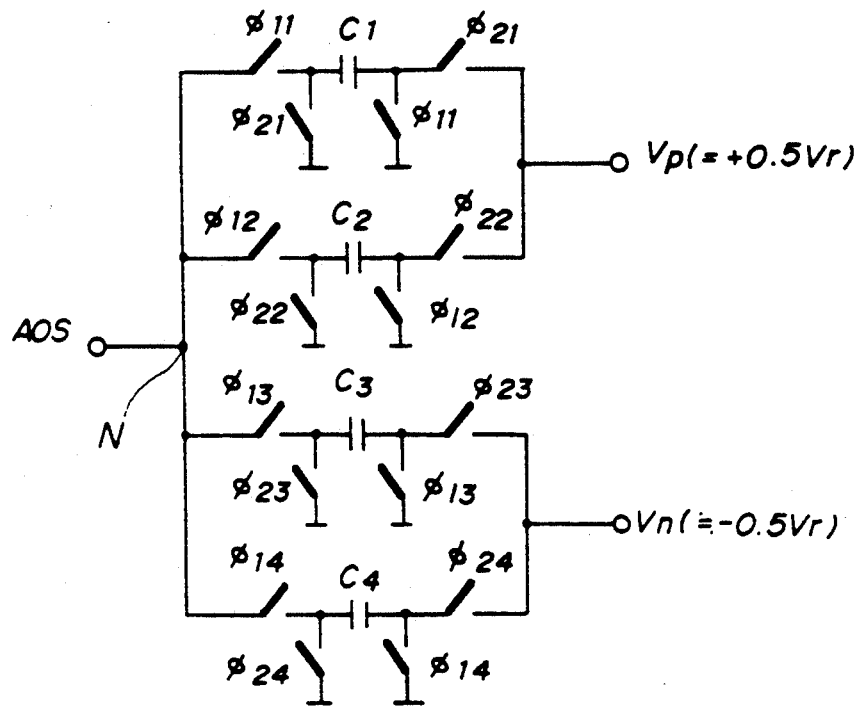

5,134,402

TRI-LEVEL DIGITAL-ANALOG CONVERTER AND ANALOG-DIGITAL CONVERTER HAVING TRI-LEVEL DIGITAL-ANALOG CONVERTER

BACKGROUND OF THE INVENTION

The present invention generally relates to digital-analog converters and analog-digital converters, and more particularly to a tri-level digital-analog converter and an analog-digital converter such as an oversampling analog-digital converter having a tri-level digital-analog converter.

Presently, much attention is directed to the oversampling analog-digital (A/D) converter. The oversampling A/D converter uses a sampling frequency which is several tens to several hundred times a band which is finally required for a converted signal. As a result, there are the following advantages in using the oversampling A/D converter.

First, it is possible to reduce the order of an analog filter which is provided at an input stage of the A/D converter for the purpose of preventing aliasing noise from mixing into the signal when carrying out the A/D conversion. Second, because it is possible to obtain a high resolution without the use of a highprecision digital-analog (D/A) converter, it is possible to use a more general less accurate analog circuit in the D/A converter.

Accordingly, it is possible to reduce the scale of the circuit because the less accurate analog circuit can be used, but on the other hand, the scale of the digital circuit increases. However, due to the recent progress in integration techniques, the digital circuit can be formed into an integrated circuit with ease even when the scale of the digital circuit is relatively large. For this reason, it is expected that the oversampling A/D converter will be used more In the oversampling A/D converter, there is a demand po increase the number of bits of the D/A converter which is provided in the A/D converter, so as to improve the signal-to-noise (S/N) ratio of the oversampling A/D converter and realize a stable operation of the oversampling A/D converter.

FIG.1 shows an example of a conventional oversampling A/D converter. A differential circuit 10 obtains a difference between an analog input signal Va and an analog input signal Vd which is output from a D/A converter 15 and corresponds to a previous sampling point. The analog input signal Va is sampled at a sampling frequency fs and supplied to the adder 10. An integrating circuit 11 integrates an output signal of the differential circuit 11, and a comparator 12 compares an output signal of the integrating circuit 11 with a predetermined threshold value. The comparator 12 outputs a digital signal having a "+1" or "−1" level depending on whether the output signal of the integrating circuit 11 has a value greater than or less than the predetermined threshold value. The density of the "+1" level portion and the "−1" level portion of the digital signal output from the comparator 12 changes depending on the analog input signal waveforms.

A delay circuit 14 delays the output digital signal of the comparator 12 by one clock (or one sample), and the D/A converter 15 converts the delayed signal from the delay circuit 14. The D/A converter 15 is of a two-level output type, and converts the delayed signal into an analog signal Vp which corresponds to the "+1" level or an analog signal Vn which corresponds to the "−1" level. An output signal of the D/A converter is supplied to the differential circuit 10 as the analog input signal Vd which corresponds to the previous sampling point.

A digital filter 13 passes the output digital signal of the comparator 12 so as to convert the original analog input signal Va into a digital signal. For example, a lowpass filter is used for the digital filter 13.

In order to improve the resolution of this conventional oversampling A/D converter, it is conceivable to (i) increase the sampling frequency, (ii) increase the order of the integrating circuit 11 to two or greater, or (iii) increase the number of bits of the D/A converter 15.

According to the methods (i) and (ii), it is possible to improve the resolution by using a sigma-delta modulator for the integrating circuit 11 and increasing the order of the modulator from one to two as shown in FIG.2. In FIG.2, the integrating circuit 11 is made up of a second order modulator which includes an adder 11a and integrators 11b and 11c, where $Z^{-1} = 1/fs$. However, when the order of the modulator is increased, the integrator shown in FIG. 2 saturates when the quantization error is large, and it becomes necessary to use a D/A converter having a large number of bits as the D/A converter 15 in order to stabilize the operation of the oversampling A/D converter.

On the other hand, according to the method (iii), majority of the D/A converters are of the 1-bit output type, and increasing the number of bits of the D/A converter 15 would mean using a 2-bit output type D/A converter, for example. However, the linearity of the 2-bit output type D/A converter is poor compared to that of the 1-bit output type D/A converter.

In other words, in the case of the 1-bit output type (two-level) D/A converter which outputs the "+1" or "−1" level, no intermediate value exists between the "+1" and "−1" levels and no non-linearity exists between the output values in principle. Hence, as indicated by a phantom line in FIG.3, for example, only a D.C. offset occurs. However, this D.C. offset does not introduce a problem because the effects of the D.C. offset can be eliminated in the digital filter 13 which is provided in a latter stage.

On the other hand, in the case of the 2-bit output type (tri-level) D/A converter which outputs the "+1", "0" or "−1" level, the intermediate value "0" exists. For this reason, no D.C. offset occurs but the linearity becomes poor as indicated by a one-dot chain line in FIG.3, for example.

When the linearity of the output signal of the D/A converter 15 becomes poor, undesired harmonics are introduced in the output of the digital filter 13. As a result, the S/N ratio of the oversampling A/D converter deteriorates. There is therefore a demand to suppress the non-linearity of the output of the tri-level D/A converter which is used in the oversampling A/D converter and improve the linearity of the output characteristic of the tri-level D/A converter.

SUMMARY OF THE INVENTION

Accordingly, it is a general object of the present invention to provide a novel and useful tri-level D/A converter and an A/D converter having a tri-level D/A converter, in which the problem described above is eliminated.

Another and more specific object of the present invention is to provide a tri-level digital-analog converter comprising first analog signal generating means for generating a first analog signal which corresponds to a "+1" level of a digital input signal, second analog signal generating means for generating a second analog signal which corresponds to a "−1" level of the digital input signal, third analog signal generating means for generating a third analog signal which corresponds to a "0" level of the digital input signal, and selector means coupled to the first, second and third analog signal generating means for selectively outputting one of the first, second and third analog signals in response to the digital input signal as an output analog signal. According to the tri-level digital-analog converter of the present invention, it is possible to obtain a satisfactory linearity in the output analog signal.

Still another object of the present invention is to provide an oversampling analog-digital converter comprising adder means for adding a converted analog signal and an analog input signal which is sampled at a predetermined frequency, integrating means for integrating an output signal of the adder means, comparator means for comparing an output signal of the integrating means with a predetermined threshold value and for outputting a digital signal depending on a comparison result, delay means for delaying the digital signal output from the comparator means by a predetermined time and for providing an output signal and a tri-level digital-analog converter for converting the output signal of the delay means into the converted analog signal. The tri-level digital-analog converter comprises first analog signal generating means for generating a first analog signal which corresponds to a "+1" level of a digital input signal, second analog signal generating means for generating a second analog signal which corresponds to a "−1" level of the digital input signal, third analog signal generating means for generating a third analog signal which corresponds to a "0" level of the digital input signal, and selector means coupled to the first, second and third analog signal generating means for selectively outputting one of the first, second and third analog signals in response to the digital input signal as an output analog signal, the converted analog signal being responsive to the output analog signal. An output digital signal of the oversampling analog-digital converter is derived from the digital signal output from the comparator means. According to the oversampling analog-digital converter of the present invention, it is possible to greatly improve the S/N ratio of the output digital signal of the oversampling analog-digital converter. In addition, it is possible to realize a highly accurate oversampling analog-digital converter which carries out a stable operation.

Other objects and further features of the present invention will be apparent from the following detailed description when read in conjunction with the accompanying drawings.

BRIEF DESCRIPTION OF THE DRAWINGS

FIG. 5 is a circuit diagram showing an embodiment of the tri-level D/A converter according to the present invention;

FIG. 6 is a diagram for explaining the control of switching elements in the embodiment shown in FIG. 5;

DESCRIPTION OF THE PREFERRED EMBODIMENTS

Figure 1:
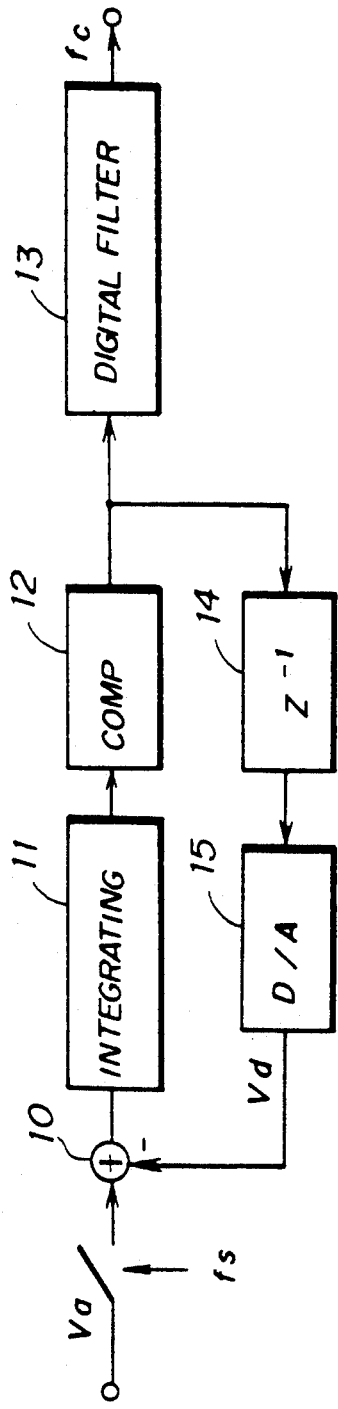
FIG. 1 is a system block diagram showing an example of a conventional oversampling A/D converter.

First, a description will be given of an operating principle of a tri-level D/A converter according to the present invention, by referring to FIG.4. The tri-level D/A converter shown in FIG.4 includes buffer circuits 1 through 4, adders 5 through 7, and a selector 8 which are connected as shown.

The buffer circuits 1 and 2 respectively
amplify an input voltage Vp (=+0.5 Vr) with an amplification "1", while the buffer circuits 3 and 4 respectively amplify an input voltage Vn (=−0.5 Vr) with an amplificatio "1". The adder 5 adds output signals of the buffer circuits 1 and 2 and supplies a first analog signal 2Vp to the selector 8. The adder 6 adds output signals of the buffer circuits 3 and 4 and supplies a second analog signal 2Vn to the selector 8. The adder 7 adds the output signals of the buffer circuits 2 and 3 and supplies a third analog signal Vp+Vn to the selector 8. The selector 8 selectively outputs one of the first, second and third analog signals 2Vp, 2Vn and Vp+Vn depending on digital input signal DIS.

The buffer circuits 1 and 2 and the adder 5 form a first analog signal generation circuit for generating the first analog signal 2Vp which corresponds to a "+1" level of the digital input signal DIS. The buffer circuits 3 and 4 and the adder 6 form a second analog signal generation circuit for generating the second analog signal 2Vn which corresponds to a "−1" level of the digital input signal DIS. In addition, the buffer circuits 2 and 3 and the adder 7 form a third analog signal generation circuit for generating the third analog signal Vp+Vn which corresponds to a "0" level of the digital input signal DIS.

The tri-level D/A converter converts the digital input signal DIS into a tri-level output analog signal AOS by selectively outputting from the selector 8 one of the first, second and third analog signals 2Vp, 2Vn and Vp+Vn depending on digital input signal DIS. In this case, the third analog signal Vp+Vn which corresponds to the "0" level is obtained by adding the first and second analog signals Vp and Vn. For this reason, the linearity among the first, second and third analog signals 2Vp, 2Vn and Vp+Vn is satisfactory.

Next, a description will be given of an embodiment of the tri-level D/A converter according to the present invention, by referring to FIG.5.

The tri-level D/A converter shown in FIG.5 includes capacitors C1 through C4, switching elements $\phi11$ through $\phi14$ and switching elements $\phi21$ through $\phi24$ which are connected as shown. In other words, the tri-level D/A converter is a switched capacitor circuit in this embodiment.

The switching elements are controlled in a charging mode so that the switching elements $\phi 11$ through $\phi 14$ are all OFF and the switching elements $\phi 21$ through $\phi 24$ are all ON. Hence, in the charging mode, the input voltage Vp ($= +0.5$ Vr) is applied to the capacitor C1 via the switching element $\phi 21$ and to the capacitor C2 via the switching element $\phi 22$.

The switching elements $\phi 11$ through $\phi 14$ are controlled in response to a tri-level digital input signal DIS which has one of "+1", "0" and "−1" levels. The charges in the capacitors C1 through C4 are discharged through the respective switching elements $\phi 11$ through $\phi 14$. Discharge currents from the capacitors C1 through C4 are added at a node N and output as the output analog signal AOS.

Figure 4:
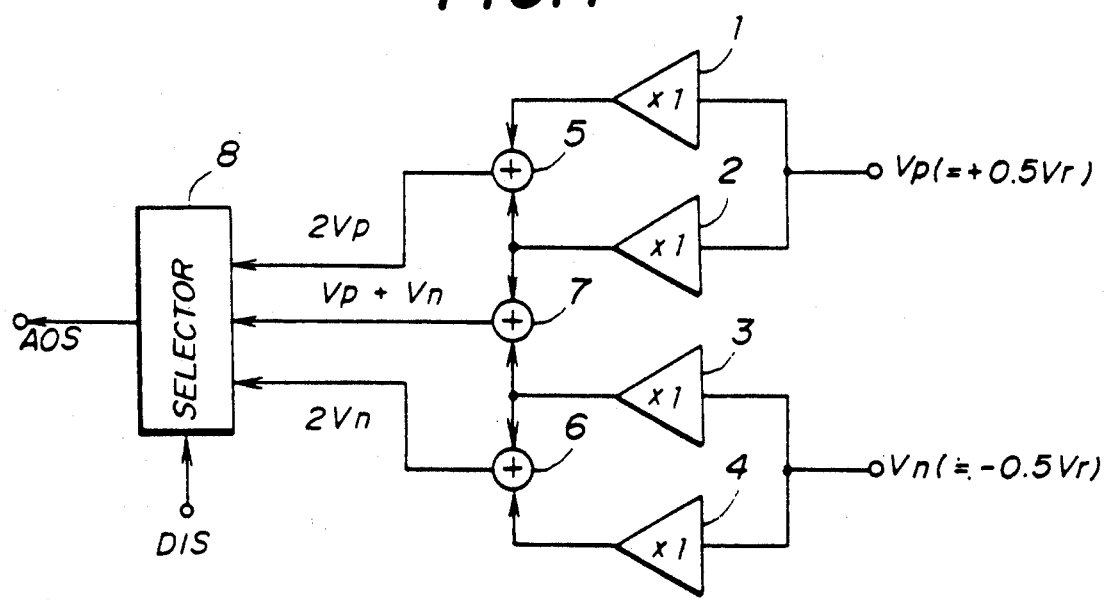
FIG. 4 is a system block diagram for explaining an operating principle of a tri-level D/A converter according to the present invention.

In FIG.5, a circuit part including the switching elements $\phi 1i$ and $\phi 2i$ and the capacitor Ci corresponds to the buffer circuit i shown in FIG.4, where i= 1, 2, 3 and 4. The node N corresponds to the adders 5, 6 and 7 shown in FIG.4. In addition, the switching of the switching elements $\phi 11$ through $\phi 14$ and the switching elements $\phi 21$ through $\phi 24$ corresponds to the selecting operation of the selector 8 shown in FIG.4.

In this embodiment, the ON/OFF states of the switching elements $\phi 11$ through $\phi 14$ and the switching elements $\phi 21$ through $\phi 24$ are controlled as shown in FIG.6 with respect to the digital input signal DIS.

In the charging mode, the switching elements $\phi 11$ through $\phi 14$ are all OFF and the switching elements $\phi 21$ through $\phi 24$ are all ON so that the capacitors C1 and C2 are respectively charged by the input voltage Vp and the capacitors C3 and C4 are respectively charged by the input voltage Vn. Then, the switching elements $\phi 21$ through $\phi 24$ are turned OFF so as to store positive charges in the capacitors C1 and C2 and store negative charges in the capacitors C3 and C4.

Next, when the digital input signal DIS having the "+1" level is input to the tri-level D/A converter, the switching elements $\phi 11$ and $\phi 12$ are turned ON and the switching elements $\phi 13$ and $\phi 14$ are turned OFF so as to discharge the positive charges stored in the capacitors C1 and C2 and use the discharge current as the output analog signal AOS corresponding to the "+1" level.

On the other hand, when the digital input signal DIS having the "−1" level is input to the tri-level D/A converter, the switching elements $\phi 11$ and $\phi 12$ are turned OFF and the switching elements $\phi 13$ and $\phi 14$ are turned ON so as to discharge the negative charges stored in the capacitors C3 and C4 and use the discharge current as the output alalog signal AOS corresponding to the "−1" level.

When the digital input signal DIS having the "" level is input to the tri-level D/A converter, the switching elements $\phi 11$ and $\phi 14$ are turned OFF and the switching elements $\phi 12$ and $\phi 13$ are turned ON so as to discharge the positive charge stored in the capacitor C2 and negative charge stored in the capacitor C3 and use the discharge current as the analog output signal AOS corresponding to the "" level.

When the tri-level D/A converter is formed by the switching capacitor circuit, the output characteristics of the tri-level D/A converter such as the linearity is determined by the accuracy of a ratio C1:C2:C3:C4, where C1, C2, C3 and C4 respectively denote the capacitances of the capacitors C1, C2, C3 and C4. Presently, the ratio C1:C2:C3:C4 can be set with extremely high accuracy to 1:1:1:1. For this reason, it is possible to greatly improve the output accuracy of the tri-level D/A converter and this considerably improving the linearity of the tri-level D/A converter.

Next, a description will be given of an embodiment of a switching control circuit 31 which generates control signals for controlling the ON/OFF states of the switching elements $\phi 11$ through $\phi 14$ and the switching elements $\phi 21$ through $\phi 24$ shown in FIG. 5, by referring to FIG.7. In this embodiment of the switching control circuit 31, it is assumed that the control signals are generated based on the output of the integrating circuit 11 shown in FIG.1 or 2. However, other measures may be taken to derive the control signals based on the digital input signal DIS.

Figure 7:
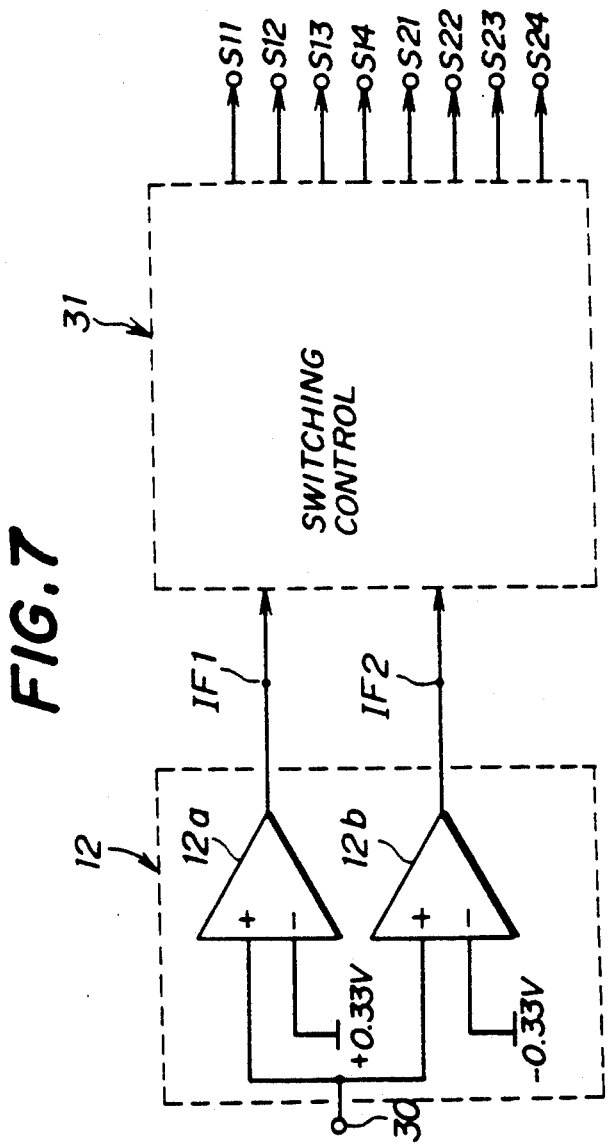
FIG. 7 is a system block diagram showing an embodiment of a timing control circuit for controlling ON/OFF states of the switching elements in the embodiment.
Figure 8:
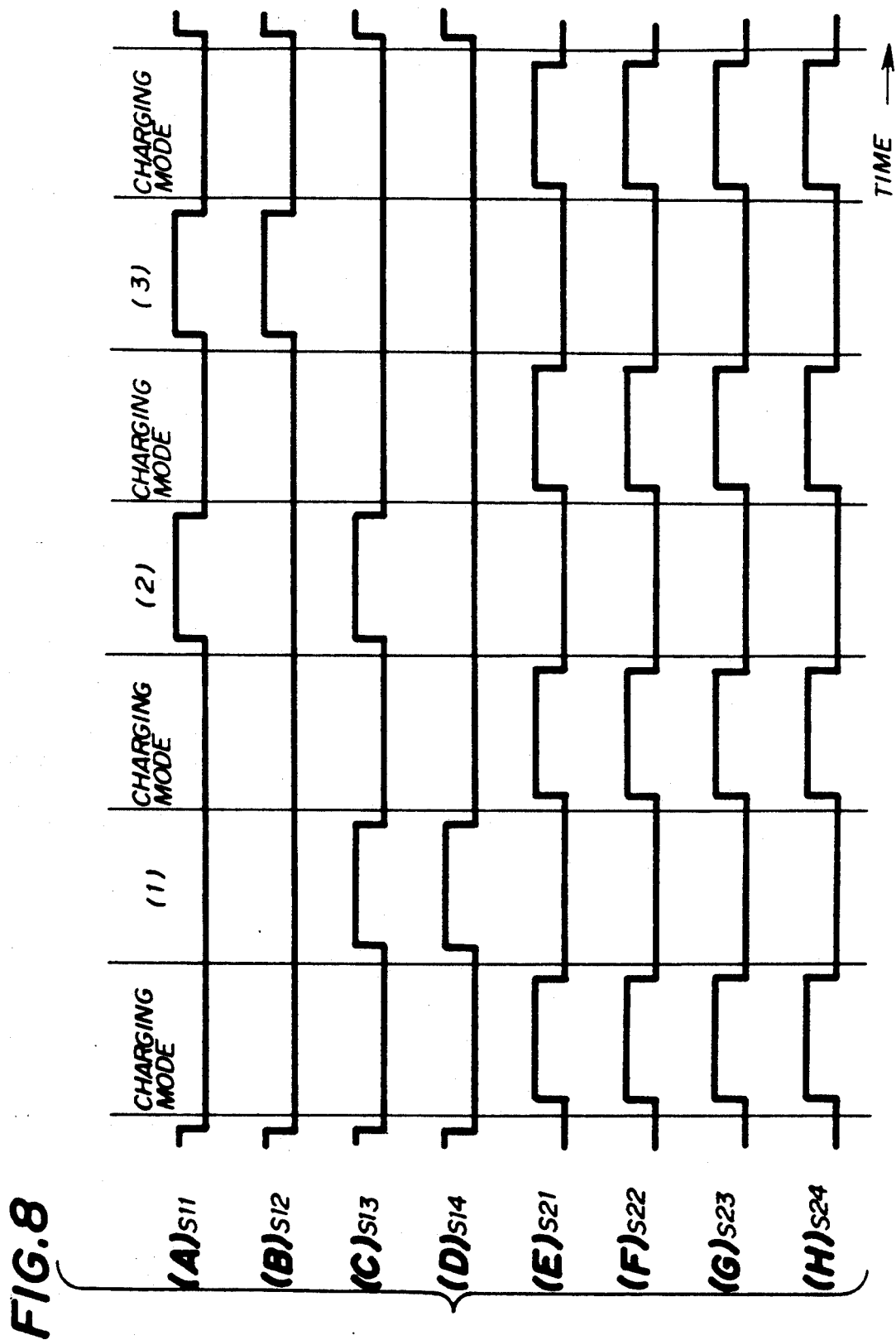
FIG. 8 is a timing chart for explaining the operation of the timing control circuit shown in FIG. 7.

In FIG.7, the comparator 12 includes first and second comparators 12a and 12b. The output signal of the integrating circuit 11 is supplied to non-inverting input terminals of the comparators 12a and 12b via a terminal 30. A voltage $+0.33$V is applied to an inverting input terminal of the first comparator 12a, and a voltage $-0.33$V is applied to an inverting input terminal of the second comparator 12b. Signals at digital interfaces IF1 and IF2 respectively have a low level in a case (1) where the output signal of the integrating circuit 11 AS at the terminal 30 is $-1 \geq AS \geq -0.333$. The signals at the digital interfaces IF1 and IF2 respectively have low and high levels in a case (2) where the output signal of the integrating circuit 11 AS at the terminal 30 is $-0.333 < AS \leq +0.333$V. In addition, the signals at the digital interfaces IF1 and IF2 respectively have a high level in a case (3) where the output signal of the integrating circuit 11 AS at the terminal 30 is $+0.333 \leq AS \leq +1$V.

Based on the signals from the digital interfaces IF1 and IF2, the switching control circuit 31 generates control signals S11 through S14 for controlling the ON/OFF states of the switching elements $\phi 11$ through $\phi 14$ and control signals S21 through S24 for controlling the ON/OFF states of the switching elements $\phi 21$ through $\phi 24$. The switching control circuit 31 generates the control signals S11 through S14 respectively shown in FIG.8(A) through (D) and the control signals S21 through S24 respectively shown in FIG.8(E) through (H) with the timing shown. For example, the switching elements $\phi 1i$ and $\phi 2i$ are turned ON when the corresponding control signals S1i and S2i have a high level and are turned OFF when the corresponding control signals S1i and S2i have a high level. The circuit construction of the switching control circuit 31 is not shown in FIG.7 because those skilled in the art may readily design various circuits for generating the control signals with the timing shown in FIG.8(A) through (H).

Next, a description will be given of a first embodiment of an A/D converter according to the present invention which has the tri-level D/A converter.

In the first embodiment of the A/D converter, the embodiment of the tri-level D/A converter is used as the D/A converter 15 shown in FIG.1. The integrating circuit 11 is made up of a first order sigma-delta modulator. Hence, according to this embodiment, it is possible to realize an oversampling A/D converter which has a high S/N ratio.

Next, a description will be given of a second embodiment of the A/D converter according to the present invention which has the tri-level D/A converter.

Figure 2:
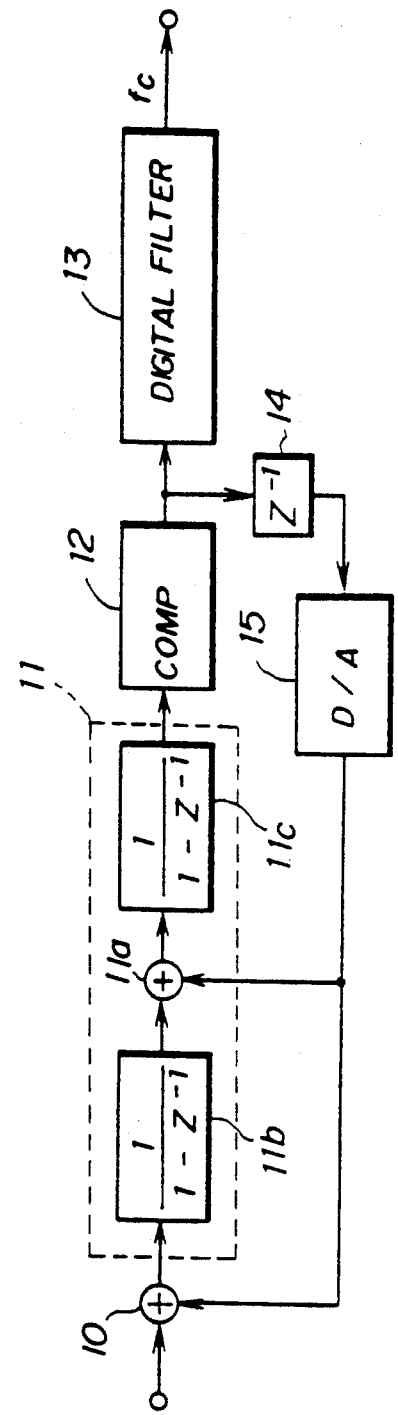
FIG. 2 is a system block diagram showing an example of a conventional oversampling A/D converter using a second order sigma-delta modulator.
Figure 3:
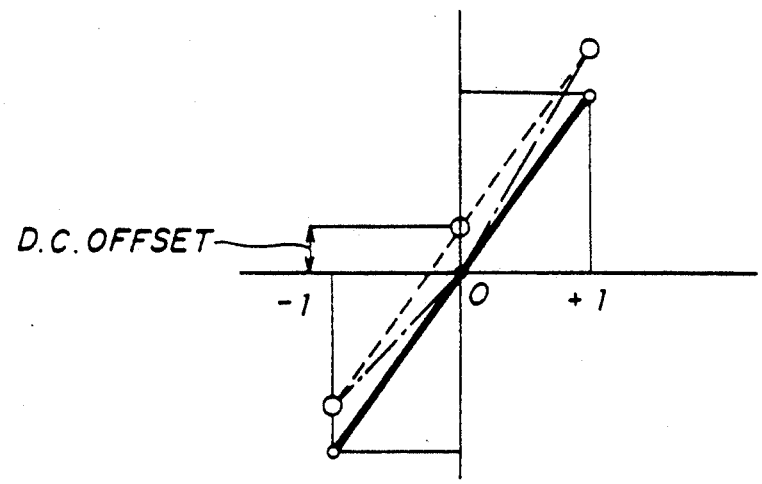
FIG. 3 is a diagram showing linearities of D/A converters.

In the second embodiment of the A/D converter, the embodiment of the tri-level D/A converter is used as the D/A converter 15 shown in FIG.2. In this embodiment, the integrating circuit 11 is made of a second order sigma-delta modulator. Hence, according to this embodiment, it is possible to realize an oversampling A/D converter which has a high S/N ratio.

Next, a description will be given of a third embodiment of the A/D converter according to the present invention which has the tri-level D/A converter.

Figure 9:
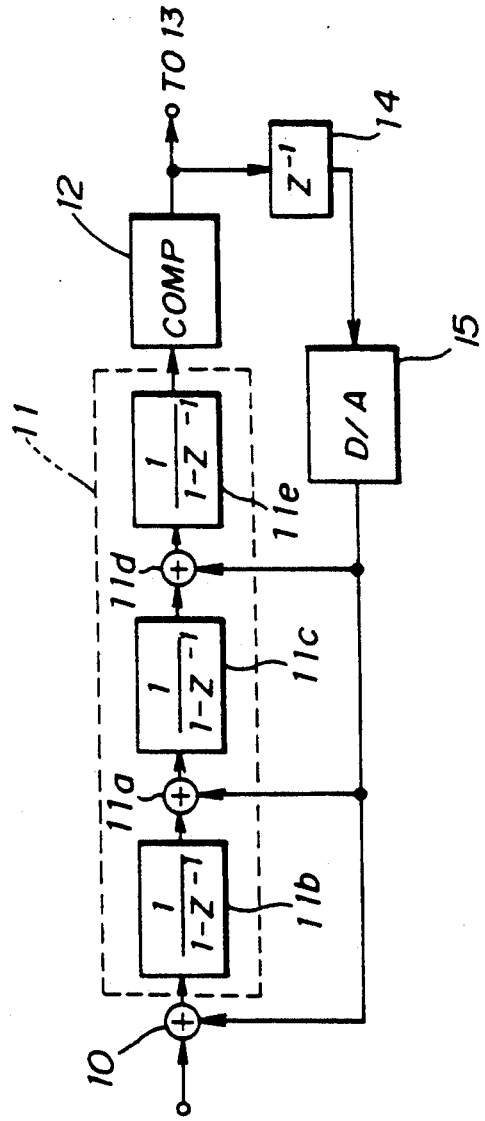
FIG. 9 is a system block diagram showing a third embodiment of an A/D converter according to the present invention.

In the third embodiment of the A/D converter, the embodiment of the tri-level D/A converter is used as the D/A converter 15 shown in FIG.9. In FIG.9, those parts which are the same as those corresponding parts in FIG.2 are designated by the same reference numerals, and a description thereof will be omitted. In this embodiment, the integrating circuit 11 is made of a third order sigma-delta modulator which includes adders 11a and 11d and integrators 11b, 11c and 11e. Hence, according to this embodiment, it is possible to realize an oversampling A/D converter which has a high S/N ratio.

Of course, the A/D converter according to the present invention may use an n-order integrating circuit, where n is a positive integer.

Further, the present invention is not limited to these embodiments, but various variations and modifications may be made without departing from the scope of the present invention.

What is claimed is:

1. A tri-level digital-analog converter supplied with a digital input signal, comprising:
   first analog signal generating means for generating a first analog signal which corresponds to a "+1" level of the digital input signal;
   second analog signal generating means for generating a second analog signal which correspodns to a "−1" level of the digital input signal;
   third analog signal generating means for generating a third analog signal which corresponds to a "0" level of the digital input signal; and
   selector means coupled to said first, second and third analog signal generating means for selectively outputting one of the first, second and third analog signals in response to said digital input signal as an output analog signal,
   wherein said tri-level digital-analog converter is supplied with positive and negative reference voltages, and
   wherein:
   said first analog signal generating means includes first and second buffer circuits which each provide output signals, and a first adder coupled to said first and second buffer circuits,
   said second analog signal generating means includes third and fourth buffer circuits which each provide output signals, and a second adder coupled to said third and fourth buffer circuits, and
   said third analog signal generating means includes the second and third buffer circuits and a third adder coupled to said second and third buffer circuits,
   said first and second buffer circuits buffering the positive reference voltage, said third and fourth buffer circuits buffering the negative reference voltage, said first adder adding the output signals of said first and second buffer circuits to provide a first signal upon which the first analog signal depends, said second adder adding the output signals of said third and fourth buffer circuits to provide a second signal upon which the second analog signal depends, and said third adder adding the output signals of said second and third buffer circuits to provide a third signal upon which the third analog signal depends.

2. A tri-level digital-analog converter supplied with a digital input signal, comprising:
   first analog signal generating means for generating a first analog signal which corresponds to a "+1" level of the digital input signal;
   second analog signal generating means for generating a second analog signal which correspodns to a "−1" level of the digital input signal;
   third analog signal generating means for generating a third analog signal which corresponds to a "0" level of the digital input signal; and
   selector means coupled to said first, second and third analog signal generating means for selectively outputting one of the first, second and third analog signals in response to said digital input signal as an output analog signal,
   wherein each of said first, second and third analog signal generating means includes a switched capacitor circuit.

3. A tri-level digital-analog converter as claimed in claim 2,
   wherein said switched capacitor circuit is supplied with a reference voltage and a plurality of control signals, and
   wherein said switched capacitor circuit includes at least one capacitor and a plurality of switching elements coupled to said capacitor for charging said capacitor by the reference voltage and discharging said capacitor in response to the plurality of control signals.

4. A tri-level digital-analog converter as claimed in claim 3, wherein said selector means includes means for generating the plurality of control signals based on said digital input signal.

5. A tri-level digital-analog converter supplied with a digital input signal, comprising:
   first analog signal generating means for generating a first analog signal which corresponds to a "+1" level of the digital input signal;
   second analog signal generating means for generating a second analog signal which correspodns to a "−1" level of the digital input signal;
   third analog signal generating means for generating a third analog signal which corresponds to a "0" level of the digital input signal; and
   selector means coupled to said first, second and third analog signal generating means for selectively outputting one of the first, second and third analog signals in response to said digital input signal as an output analog signal,
   wherein said tri-level digital-analog converter is supplied with positive and negative reference voltages, and
   wherein:
   said first analog signal is 2Vp,
   said second analog signal is 2Vn, and
   said third analog signal is Vp+Vn, where Vp denotes the positive reference voltage and Vn denotes the negative reference voltage.

6. An oversampling analog-digital converter supplied with an analog input signal which is sampled at a predetermined frequency, comprising:

adder means for adding a converted analog signal and the analog input signal which is sampled at the predetermined frequency;

itnegrating means for itnegrating an output signal of said adder means, and for providing an output signal;

comparator means for comparing the output signal of said integrating means with a predetermined threshold value and for outputting a digital signal depending on a comparision result;

delay means for delaying the digital signal output from said comparator means by a predetermined time, and for providing a digital input signal; and a tri-level digital-analog converter for converting the digital input signal from said delay means into said converted analog signal, said tri-level digital-analog converter comprising:

first analog signal generating means for generating a first analog signal which corresponds to a "+1" level of a digital input signal;

second analog signal generating means for generating a second analog signal which corresponds to a "−1" level of the digital input signal;

third analog signal generating means for generating a third analog signal which corresponds to a "0" level of the digital input signal; and selector means coupled to said first, second and third analog signal generating means for selectively outputting one of the first, second and third analog signals in response to said digital input signal as an output analog signal, said converted analog signal being responsive to the output analog signal, and an output digital signal of said oversampling analog-digital converter being derived from the digital signal output from said comparator means, wherein said oversampling analog-digital converter is supplied with positive an negative reference voltages, and wherein:

said first analog signal generating means includes first and second buffer circuits which each provide output signals, and a first adder coupled to said first and second buffer circuits, said second analog signal generating means includes third and fourth buffer circuits which each provide output signals, and a second adder coupled to said third and fourth buffer circuits, and said third analog signal generating means includes the second and third buffer circuits and a third adder coupled to said second and third buffer circuits, said first and second buffer circuits buffering the positive reference voltage, said third and fourth buffer circuits buffering the negative reference voltage, said first adder adding the output signals of said first and second buffer circuits to provide a first signal upon which the first analog signal depends, said second adder adding the output signals of said third and fourth buffer circuits to provide a second signal upon which the second analog signal depends, and said third adder adding the output signals of said second and third buffer circuits to provide a third signal upon which the third analog signal depends.

7. An oversampling analog-digital converter supplied with an analog input signal which is sampled at a predetermined frequency, comprising:

adder means for adding a converted analog signal and the analog input signal which is sampled at the predetermined frequency;

itnegrating means for itnegrating an output signal of said adder means, and for providing an output signal;

comparator means for comparing the output signal of said integrating means with a predetermined threshold value and for outputting a digital signal depending on a comparision result;

delay means for delaying the digital signal output from said comparator means by a predetermined time, and for providing a digital input signal; and a tri-level digital-analog converter for converting the digital input signal from said delay means into said converted analog signal, said tri-level digital-analog converter comprising:

first analog signal generating means for generating a first analog signal which corresponds to a "+1" level of a digital input signal;

second analog signal generating means for generating a second analog signal which corresponds to a "−1" level of the digital input signal;

third analog signal generating means for generating a third analog signal which corresponds to a "0" level of the digital input signal; and selector means coupled to said first, second and third analog signal generating means for selectively outputting one of the first, second and third analog signals in response to said digital input signal as an output analog signal, said converted analog signal being responsive to the output analog signal, and an output digital signal of said oversampling analog-digital converter being derived from the digital signal output from said comparator means, and wherein each of said first, second and third analog signal generating means includes a switched capacitor circuit.

8. The oversampling analog-digital converter as claimed in claim 7, wherein said switched capacitor circuit is supplied with a reference voltage and a plurality of control signals, and wherein said switched capacitor circuit includes at elast one capacitor and a plurality of switching elements coupled to said capacitor for charging said capacitor by the reference voltage and discharging said capacitor in response to the plurality of control signals.

9. The oversampling analog-digital converter as claimed in claim 8, wherein said selector means includes means for generating the plurality of control signals based on said digital input signal.

10. An oversampling analog-digital converter supplied with an analog input signal which is sampled at a predetermined frequency, comprising:

adder means for adding a converted analog signal and the analog input signal which is sampled at the predetermined frequency;

itnegrating means for itnegrating an output signal of said adder means, and for providing an output signal;

comparator means for comparing the output signal of said integrating means with a predetermined threshold value and for outputting a digital signal depending on a comparision result;

delay means for delaying the digital signal output from said comparator means by a predetermined time, and for providing a digital input signal; and a tri-level digital-analog converter for converting the digital input signal from said delay means into said converted analog signal, said tri-level digital-analog converter comprising:

first analog signal generating means for generating a first analog signal which corresponds to a "+1" level of a digital input signal;

second analog signal generating means for generating a second analog signal which corresponds to a "−1" level of the digital input signal;

third analog signal generating means for generating a third analog signal which corresponds to a "0" level of the digital input signal; and selector means coupled to said first, second and third analog signal generating means for selectively outputting one of the first, second and third analog signals in response to said digital input signal as an output analog signal, said converted analog signal being responsive to the output analog signal, and an output digital signal of said oversampling analogdigital converter being derived from the digital signal output from said comparator means, wherein said oversampling analog-digital converter is supplied with positive and negative reference voltages, and wherein:

said first analog signal is 2Vp, said second analog signal is 2Vn, and said third analog signal is Vp+Vn, where Vp denotes the positive reference voltage and Vn denotes the negative reference voltage.

11. An oversampling analog-digital converter supplied with an analog input signal which is sampled at a predetermined frequency, comprising:

adder means for adding a converted analog signal and the analog input signal which is sampled at the predetermined frequency;

itnegrating means for itnegrating an output signal of said adder means, and for providing an output signal;

comparator means for comparing the output signal of said integrating means with a predetermined threshold value and for outputting a digital signal depending on a comparision result;

delay means for delaying the digital signal output from said comparator means by a predetermined time, and for providing a digital input signal; and a tri-level digital-analog converter for converting the digital input signal from said delay means into said converted analog signal, said tri-level digital-analog converter comprising:

first analog signal generating means for generating a first analog signal which corresponds to a "+1" level of a digital input signal;

second analog signal generating means for generating a second analog signal which corresponds to a "−1" level of the digital input signal;

third analog signal generating means for generating a third analog signal which corresponds to a "0" level of the digital input signal; and selector means coupled to said first, second and third analog signal generating means for selectively outputting one of the first, second and third analog signals in response to said digital input signal as an output analog signal, said converted analog signal being responsive to the output analog signal, and an output digital signal of said oversampling analogdigital converter being derived from the digital signal output from said comparator means, wherein said integrating means includes an n-order sigma-delta modulator, where n is a positive itneger.

12. The oversampling analog-digital converter as claimed in claim 11, wherein n is a number selected from the group consistinf of 1, 2 and 3.

13. An oversampling analog-digital converter supplied with an analog input signal which is sampled at a predetermined frequency, comprising:

adder means for adding a converted analog signal and the analog input signal which is sampled at the predetermined frequency;

itnegrating means for itnegrating an output signal of said adder means, and for providing an output signal;

comparator means for comparing the output signal of said integrating means with a predetermined threshold value and for outputting a digital signal depending on a comparision result;

delay means for delaying the digital signal output from said comparator means by a predetermined time, and for providing a digital input signal; and a tri-level digital-analog converter for converting the digital input signal from said delay means into said converted analog signal, said tri-level digital-analog converter comprising:

first analog signal generating means for generating a first analog signal which corresponds to a "+1" level of a digital input signal;

second analog signal generating means for generating a second analog signal which corresponds to a "−1" level of the digital input signal;

third analog signal generating means for generating a third analog signal which corresponds to a "0" level of the digital input signal; and selector means coupled to said first, second and third analog signal generating means for selectively outputting one of the first, second and third analog signals in response to said digital input signal as an output analog signal, said converted analog signal being responsive to the output analog signal, and an output digital signal of said oversampling analogdigital converter being derived from the digital signal output from said comparator means, the oversampling analog-digital converter further comprising:

a digital filter which receives the digital signal from said comparator means and outputs the output digital signal of said oversampling analog-digital converter.

14. A method for generating an output analog signal responsive to a digital input signal, comprising the steps of:

(a) generating a first analog signal which is otuput as the output analog signal when the digita input signal has a first level;

(b) generating a second analog signal which is output as the output analog signal when the digital input signal has a second level; and (c) generating a third analog signal which is output as the output analog signal when the digital input signal has a third level, wherein said first, second and third analog signals are generated from positive and negative reference voltages, Vp and Vn, respectively, and wherein:

said first analog signal is 2Vp, said second analog signal is 2Vn, and said third analog signal is Vp+Vn, where Vp denotes the positive reference voltage and Vn denotes the negative reference voltage.

15. A method as claimed in claim 14, wherein said steps (a)-(c) include:

generating each of the first, second and third analog signals by a discharge of first, second and third capacitors, respectively.

16. A method as claimed in claim 14, wherein said steps (a)-(c) include:

generating each of the first, second and third analog signals by a discharge of first, second and third pluralities of capacitors, respectively.

17. A method for generating an output analog signal responsive to a digital input signal, comprising the steps of:

(a) generating a first analog signal which is otuput as the output analog signal when the digita input signal has a first level;

(b) generating a second analog signal which is output as the output analog signal when the digital input signal has a second level; and (c) generating a third analog signal which is output as the output analog signal when the digital input signal has a third level;

wherein said steps (a)-(c) include:

generating each of the first, second and third analog signals by a discharge of first, second and third capacitors, respectively.

18. A method for generating an output analog signal responsive to a digital input signal, comprising the steps of:

(a) generating a first analog signal which is otuput as the output analog signal when the digita input signal has a first level;

(b) generating a second analog signal which is output as the output analog signal when the digital input signal has a second level; and (c) generating a third analog signal which is output as the output analog signal when the digital input signal has a third level, wherein said steps (a)-(c) include:

generating each of the first, second and third pluralities of capacitors, respectively.

* * * * *

UNITED STATES PATENT AND TRADEMARK OFFICE
CERTIFICATE OF CORRECTION

PATENT NO. : 5,134,402                          Page 1 of 2
DATED : July 28, 1992
INVENTOR(S) : Seiji MIYOSHI It is certified that error appears in the above-identified patent and that said Letters Patent is hereby corrected as shown below:

```
Column 1, line 37, after "more" insert
    --frequently in the future--;
Column 1, line 39, change "po" to --to--.
Column 4, line 28, change "amplificatio"
    to --amplification--.
Column 6, line 2, change "improving" to
    --improves--.
Column 10, line 46, change "elast"
    to --least--.
Column 11, line 25, change "logdigital"
    to --log-digital--.
Column 12, line 5, change "logdigital"
    to --log-digital--;
```

UNITED STATES PATENT AND TRADEMARK OFFICE
CERTIFICATE OF CORRECTION

PATENT NO. : 5,134,402
DATED : July 28, 1992
INVENTOR(S) : Seiji MIYOSHI It is certified that error appears in the above-identified patent and that said Letters Patent is hereby corrected as shown below:

```
Column 12, line 12, change "consistinf"
    to --consisting--.
Column 13, line 25, change "digita"
    to --digital--.
Column 14, line 15, change "digita"
    to --digital--;
Column 14, line 24, after "third"
    insert --analog signals by
    a discharge of first, second
    and third--.
```

Signed and Sealed this

Twenty-fourth Day of August, 1993

Attest:

BRUCE LEHMAN

*Attesting Officer*       *Commissioner of Patents and Trademarks*